United States Patent
Ye et al.

(10) Patent No.: US 11,349,048 B2
(45) Date of Patent: May 31, 2022

(54) UV LED PACKAGE STRUCTURE FOR IMPROVING LIGHT EXTRACTION

(71) Applicant: HARVATEK CORPORATION, Hsinchu (TW)

(72) Inventors: Zhi Ting Ye, Hsinchu (TW); Shyi Ming Pan, Hsinchu (TW); Feng Hui Chuang, Hsinchu (TW)

(73) Assignee: Harvatek Corporation, Hsin Chu (TW)

( * ) Notice: Subject to any disclaimer, the term of this patent is extended or adjusted under 35 U.S.C. 154(b) by 58 days.

(21) Appl. No.: 16/672,795

(22) Filed: Nov. 4, 2019

(65) Prior Publication Data

US 2021/0135057 A1 May 6, 2021

(51) Int. Cl.
*H01L 33/44* (2010.01)
*H01L 33/58* (2010.01)
*H01L 33/56* (2010.01)
*H01L 33/32* (2010.01)
*H01L 33/34* (2010.01)

(52) U.S. Cl.
CPC .............. *H01L 33/44* (2013.01); *H01L 33/32* (2013.01); *H01L 33/346* (2013.01); *H01L 33/56* (2013.01); *H01L 33/58* (2013.01)

(58) Field of Classification Search
None
See application file for complete search history.

(56) References Cited

U.S. PATENT DOCUMENTS

2018/0062048 A1\* 3/2018 Qin ..................... H01L 33/60
2020/0395517 A1\* 12/2020 Tsai ....................... H01L 33/62

FOREIGN PATENT DOCUMENTS

CN 108389951 A 8/2018
TW 201721907 A 6/2017

OTHER PUBLICATIONS

Translation of CN108389951A (Year: 2018).\*
Foreign Patent Search Document Issued By a Foreign Patent Office (10920701870).

\* cited by examiner

*Primary Examiner* — Xiaoming Liu
(74) *Attorney, Agent, or Firm* — Rosenberg, Klein & Lee

(57) ABSTRACT

The application is related to a UV LED package structure for improving light extraction efficiency. An UV LED chip is set on a substrate with an anti-flare film for increasing upward light extraction to concentrate the emitted light by an optical element. Because no glue is filled between the UV LED chip and the optical element, it will be prevented the glue from spoiling and deteriorating by the UV light from the UV LED chip. Thereby, the UV LED package structure can prevent from the light performance reducing.

6 Claims, 7 Drawing Sheets

UV LED PACKAGE STRUCTURE FOR IMPROVING LIGHT EXTRACTION

FIELD OF THE INVENTION

The present application relates generally to a package structure, and particularly to an ultraviolet light-emitting diode (UV LED) package structure for improving light extraction efficiency.

BACKGROUND OF THE INVENTION

LEDs are semiconductor electronic devices capable of emitting light. They also own the advantages of saving power, high efficiency, fast response, long lifetime, no mercury, and environment friendliness. In recent years, they are widely applied to lighting. Generally, the requirement for LED packages is not only in protecting LED chips. They are particularly required in transparency of the material, the package method, and the package structure. At early stages, LEDs emit visible light. Now, invisible LEDs are developed. In particular, UV LED products are mainly applied to light curing market. Compared with traditional light curing, UV-LED light curing has superior curing efficiency. For example, the illumination intensity (W) and energy (J) of UV LED is superior to tradition light-curing sources, giving stronger illumination intensity. In addition, the speed of forming using UV LED as the light source for curing is faster. Consequently, the market of light curing using UV LED is growing rapidly.

Furthermore, UV LEDs can be further applied to antibiosis, dust prevention, purification, sterilization, and similar biochemical applications with superior performance. Since UV LEDs have the advantages of small size, long lifetime, and low power consumption, their applications are not limited to the light curing market. They can be applied to air purifiers, water purifiers, refrigerators, air conditioners, home appliances such as dish washers, and medical equipment and alike. They have become indispensable devices in lives.

Nonetheless, due to cost considerations, the material for packaging LEDs is mostly polyphthalamide (PPA, a thermoplastic). Under long-term UV exposure, the material will deteriorate or the packaging glue will peel off. In current technologies, some uniformizes the light for mitigating over concentration of UV light and hence extending the lifetime of the packaging material. Unfortunately, the situations of material embrittlement or peeling of packaging glue still occur.

Accordingly, the present application provides a UV LED package structure with enhancing light extraction efficiency. By using an anti-reflection layer with accompanying optical members, the light extraction efficiency above a UV LED chip can be enhanced. Hence, the light-emitting efficiency of UV LED chip can be improved and the deterioration of packaging materials can be avoided.

SUMMARY

An objective of the present application is to provide a UV LED package structure with enhancing light extraction efficiency. An optical coating-film is disposed on the substrate and surrounding a UV LED chip and an anti-reflection layer is disposed on the UV LED for enhancing the light extraction efficiency above the UV LED chip. Hence, the light-emitting efficiency of the UV LED chip can be improved and the deterioration of packaging materials can be avoided.

To achieve the above objective, the present application discloses a UV LED package structure with enhancing light extraction efficiency, which comprises a substrate, an UV LED chip, an anti-reflection layer, an optical coating-film, and an optical member. The UV LED chip and the anti-reflection layer are disposed on the substrate sequentially. The anti-reflection layer covers the UV LED chip. The optical member is located on the anti-reflection layer. The optical member includes a accommodation space for covering the UL LED and the anti-reflection layer. There is a gap between the optical member and both of the UV LED chip and the anti-reflection layer. In other words, the optical member covers the UV LED chip and the anti-reflection layer with the accommodation space. The material of the anti-reflection layer is selected from the group consisting of hafnium compounds and magnesium compounds. Besides, the accommodation space is filled with air or vacuum. The optical member is used to concentrate light. The UV LED chip emits UV light upwards and laterally. The upward UV light passes through the anti-reflection layer and the accommodation space, and then passes upwards through the optical member. The lateral UV light is reflected by the optical coating-film, passes through the accommodation space, and then passes through the optical member. Thereby, the light extraction efficiency of the UV LED chip can be enhanced. Hence, the light-emitting efficiency of the UV LED chip can be improved and the deterioration of packaging materials can be avoided.

According to an embodiment of the present application, the material of the anti-reflection layer is selected from the group consisting of silicon oxide, aluminum oxide, magnesium oxide, yttrium oxide ($Y_2O_3$), calcium fluoride, beryllium oxide, gadolinium oxide ($Gd_2O_3$), calcium oxide, thorium oxide ($ThO_2$), and lead lanthanum zirconate titanate ceramics (PLZT).

According to an embodiment of the present application, a first width of the optical member is at least five times a second width of the UV LED chip.

According to an embodiment of the present application, the material of the optical member is quartz.

According to an embodiment of the present application, the surface of the optical member is further coated by silicon oxide or silicon.

According to an embodiment of the present application, the substrate is a conductive substrate or a nonconductive substrate.

According to an embodiment of the present application, the material of the nonconductive substrate is selected from the group consisting of aluminum nitride and aluminum oxide.

According to an embodiment of the present application, the aluminum layer is a fully covered aluminum part or a plurality of annular aluminum parts. The reflection intensity of the plurality of annular aluminum parts decreases gradually from the inside to the outside.

DETAILED DESCRIPTION

In order to make the structure and characteristics as well as the effectiveness of the present application to be further understood and recognized, the detailed description of the present application is provided as follows along with embodiments and accompanying figures.

Given the influence of the UV LED technology according to the prior art on the package glue, the present application provides a UV LED package structure with enhancing light extraction efficiency and the method for manufacturing the same for solving the deterioration problem of package glue due to UV light in the UV LED package structure according to the prior art.

In the following, the properties and the accompanying structures of the UV LED package structure with enhancing light extraction efficiency according to the present application will be described.

Figure 1:
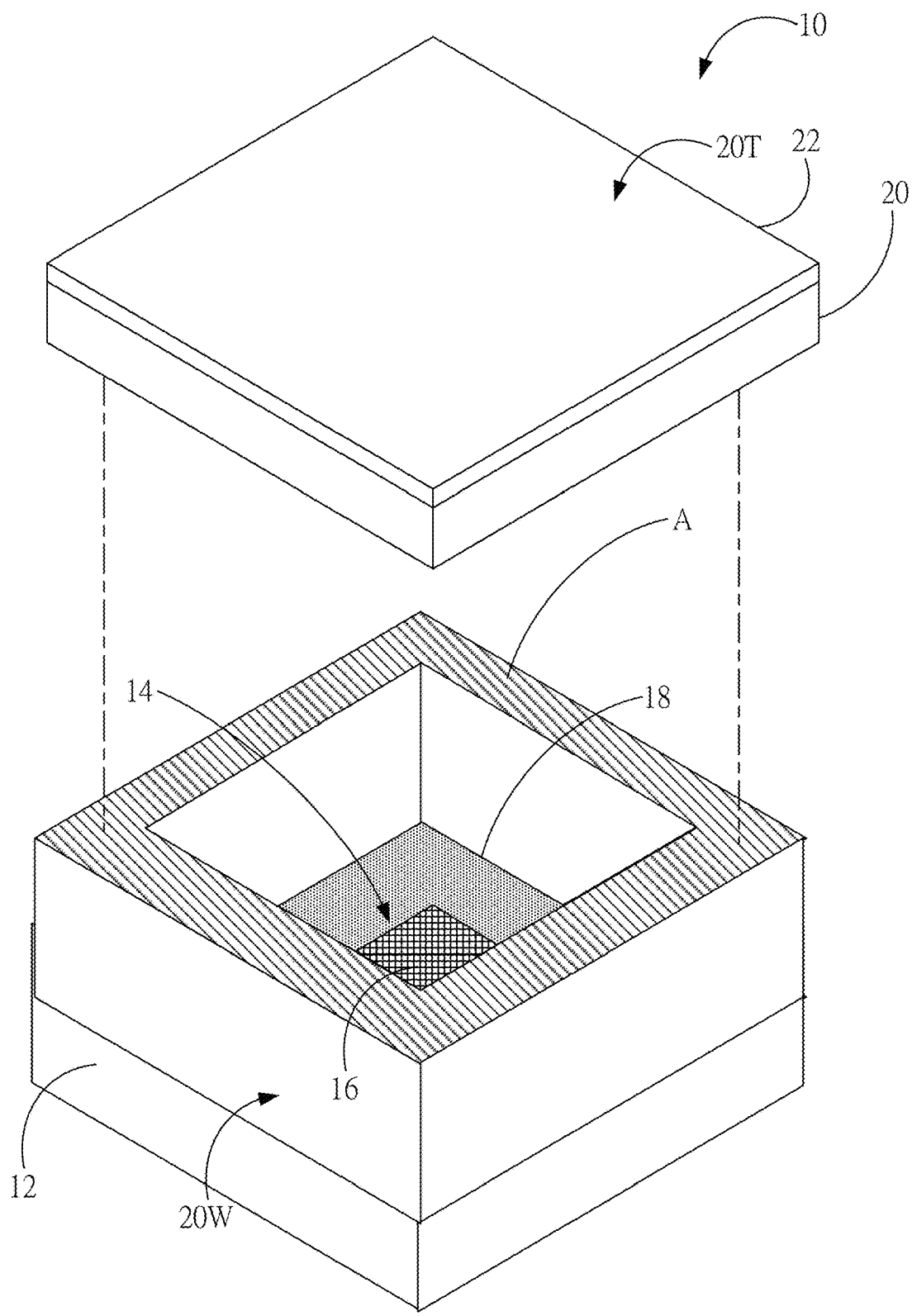
FIG. 1 shows a structure schematic diagram of the UV LED package structure according to an embodiment of the present application.
Figure 2:
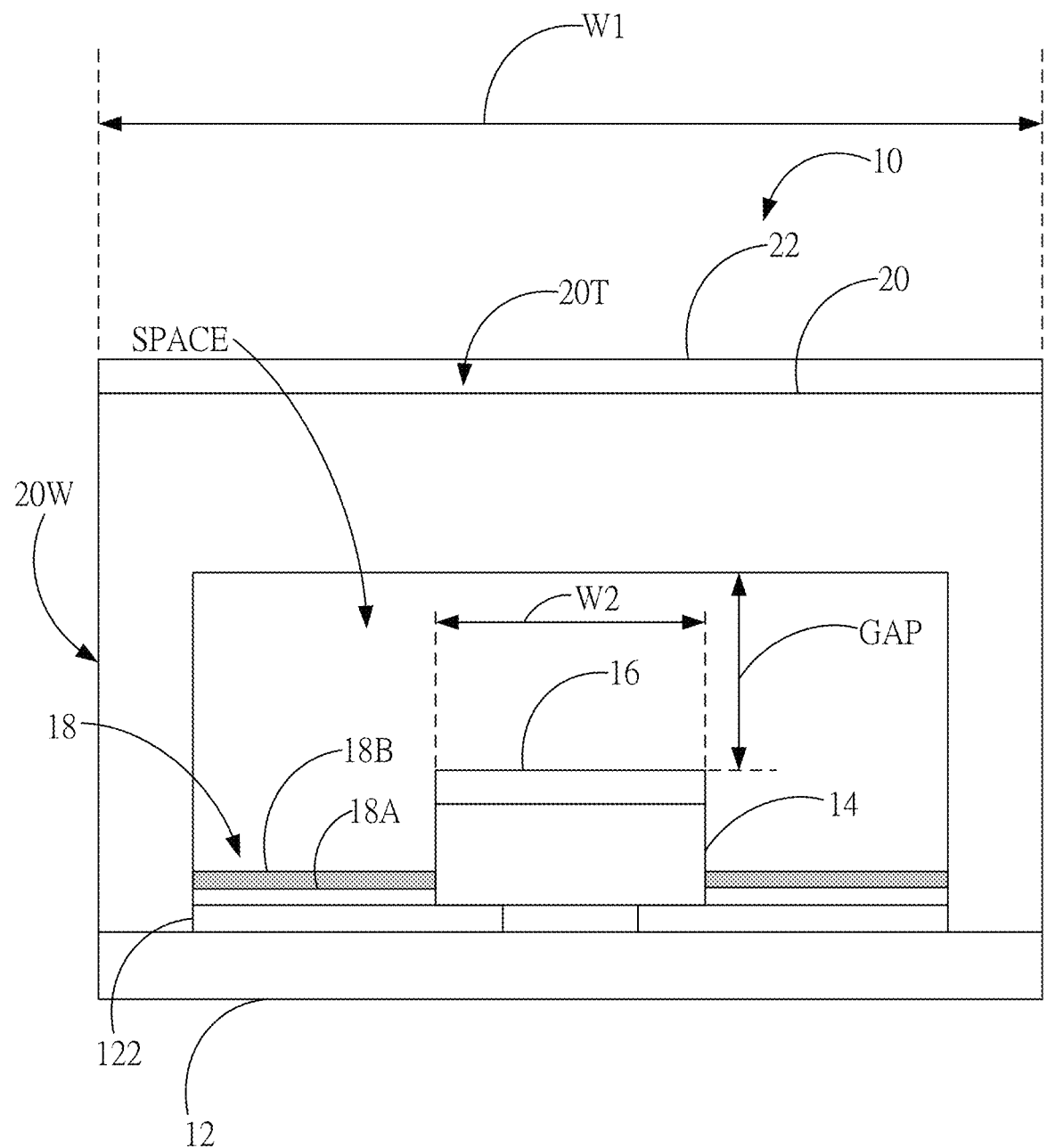
FIG. 2 shows a side view of the UV LED package structure according to an embodiment of the present application.

First, please refer to FIG. 1 and FIG. 2, which show a structure schematic diagram and a side view of the UV LED package structure according to an embodiment of the present application. As shown in the figures, the package structure 10 for UV LED according to the present application comprises a substrate 12, a UV LED chip 14, an anti-reflection layer 16, an optical coating-film 18, and an optical member 20. The substrate 12 according to the present embodiment is a nonconductive substrate. Besides, it can be a conductive substrate instead. The UV LED chip 14 according to the present embodiment is a flip-chip design disposed on the substrate 12. Thereby, the substrate 12 further includes a circuit pattern layer 122 for the UV LED chip 14 to connect to the external circuits. The anti-reflection layer 16 is disposed on the UV LED chip 14. By taking advantages of material characteristics, the anti-reflection layer 16 enables the upward-emitted light from the UV LED chip 14 less prone to total reflection and hence enhancing the light extraction efficiency above the UV LED chip 14.

The material of the anti-reflection layer 16 is selected from the group consisting of hafnium compounds and magnesium compounds. Furthermore, the material of the anti-reflection layer 16 is selected from the group consisting of silicon oxide, aluminum oxide, magnesium oxide, yttrium oxide ($Y_2O_3$), calcium fluoride, beryllium oxide, gadolinium oxide ($Gd_2O_3$), calcium oxide, thorium oxide ($ThO_2$), and lead lanthanum zirconate titanate ceramics (PLZT). According to the present embodiment, hafnium oxide, quartz, magnesium fluoride, and aluminum oxide are taken as examples as shown in Table 1.

TABLE 1

| Light extraction efficiency for different materials of anti-reflection layer | | |
|---|---|---|
| Directly above | Peripheral | Overall |
| | HfO2 + MgF2 | |
| 27.247% | 5.278% | 32.525% |
| | Al2O3 + MgF2 | |
| 27.242% | 5.259% | 32.501% |
| | Al2O3 + SiO2 | |
| 27.230% | 5.263% | 32.493% |
| | HfO2 + SiO2 | |
| 27.226% | 5.263% | 32.525% |

According to Table 1, the material of the anti-reflection layer 16 for the package structure 10 for UV LED according to the present application is selected from the group consisting of hafnium oxide, quartz, magnesium fluoride, and aluminum oxide for forming the anti-reflection layer 16 on the UV LED. The above four combinations of the materials can reach reflectivity of 0.1% for 265-280 nm and the overall light extraction efficiency are all increased. In addition, as shown in Table 2, the anti-reflection layer 16 is normal quartz or quartz with coating. The difference in transmittivity is about 5%.

TABLE 2

| Transmittivity of quartz as anti-reflection layer | |
|---|---|
| Item | Transmittivity |
| Normal quartz | 92% |
| Quartz with coating | 97% |

Furthermore, please refer again to FIG. 1 and FIG. 2. The optical member 20 is a closed device sealed on the substrate 12. The material of the optical member 20 is quartz. The optical member 20 further includes a coating layer 22 on the surface. The material of the coating layer 22 is selected from the group consisting of silicon oxide and silicon. Thereby, the transmittivity of the optical member 20 is greater than 90%. The optical member 20 includes a accommodation space SPACE filled with air or vacuum. In addition, the accommodation space SPACE covers the UV LED chip 14 and the anti-reflection layer 16. Thereby, the accommodation space SPACE further covers the light-emitting direction of the UV LED chip 14. Namely, the top 20T and the sidewall W of the optical member 20 cover the light-emitting directions except the substrate 12 side. By means of the accommodation space SPACE, there is a gap GAP between the optical member 20 and the UV LED chip 14, as well between the optical member 20 and the anti-reflection layer 16. Moreover, the material of the optical member 20 is preferably quartz for its better transmittivity. The transmittivity of normal glass for wavelengths less than 300 nm is low. Contrarily, for quartz, the transmittivity is superior to the package materials according to the prior art and less prone to the deterioration caused by UV illumination. Please refer again to FIG. 2, a first width W1 of the optical member 20 is at least five times a second width W2 of the UV LED chip 14. Thereby, the transmittivity of the optical member 20 will be greater than 90%.

Figure 3:
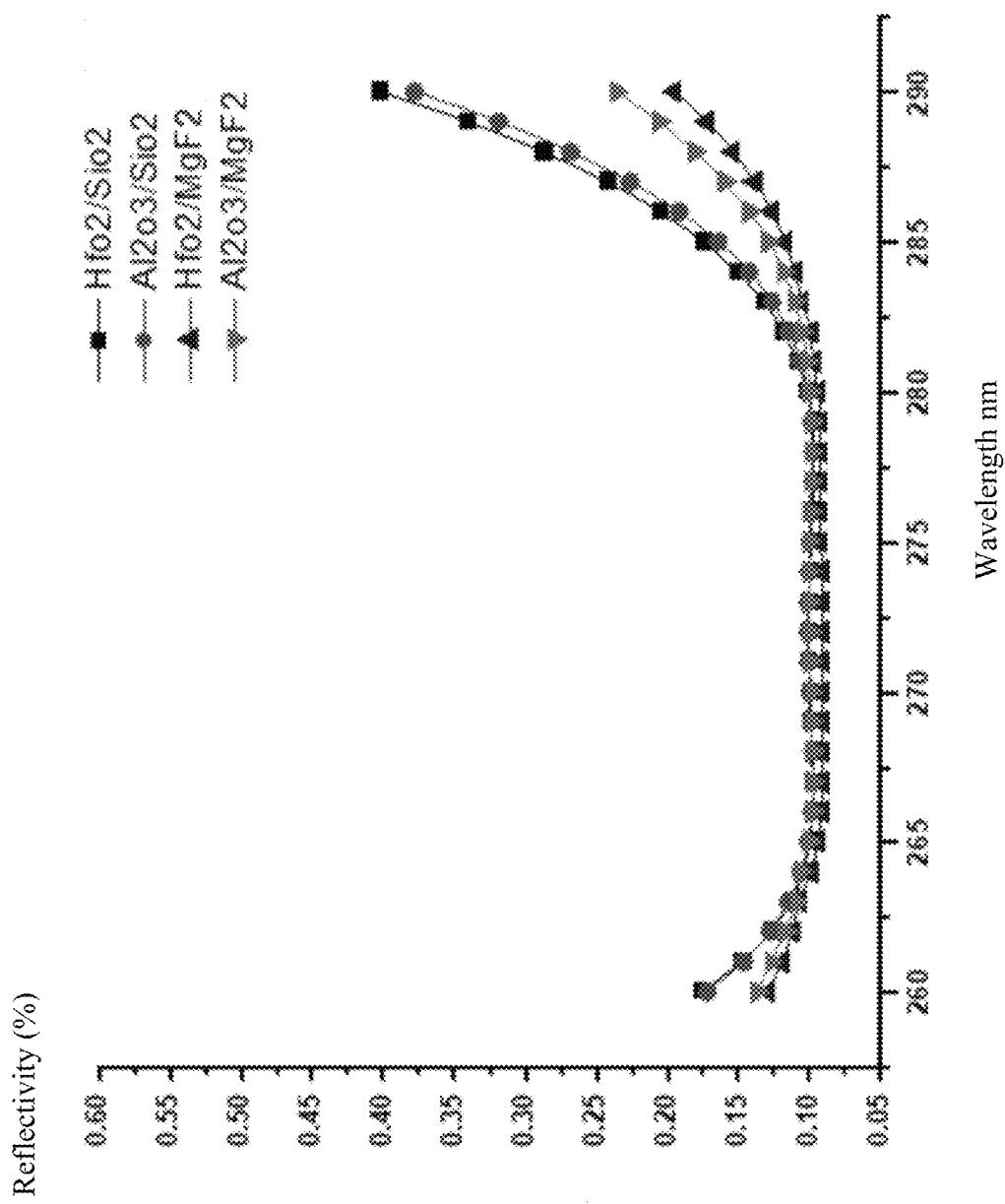
FIG. 3 shows curves of the reflectivity of the anti-reflection layer in the UV LED package structure according to an embodiment of the present application.

As shown in FIG. 3, the material of the anti-reflection layer 16 is selected from the group consisting of silicon oxide, aluminum oxide, magnesium oxide, yttrium oxide ($Y_2O_3$), calcium fluoride, beryllium oxide, gadolinium oxide ($Gd_2O_3$), calcium oxide, thorium oxide ($ThO_2$), and lead lanthanum zirconate titanate ceramics (PLZT). According to the present embodiment, hafnium oxide, quartz, magnesium fluoride, and aluminum oxide are taken as examples. The reflectivity of the anti-reflection layer 16 between the wavelengths 260 nm and 290 nm does not exceed 1%. That is to say, the anti-reflection effect of the anti-reflection layer 16 for UV light is superior.

Figure 4:
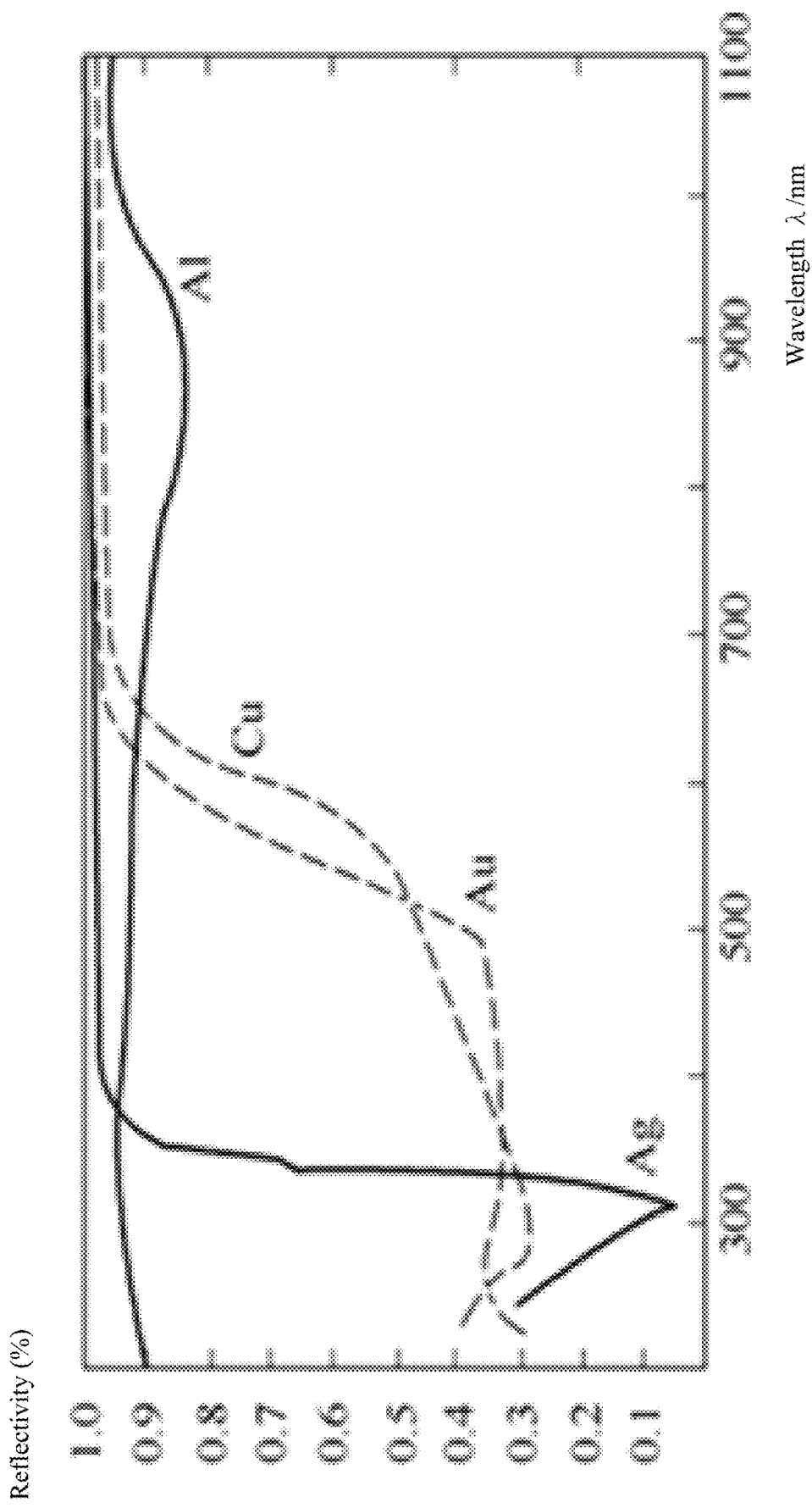
FIG. 4 shows a schematic diagram of the reflectivity of metals according to an embodiment of the present application.

The package structure 10 further comprises an optical coating-film 18 disposed on the substrate 12 and located surrounding the UV LED chip 14. Thereby, the lateral light emitted by the UV LED chip 14 will be reflected upward. The UV light emitted by the UV LED chip 14 according to the present embodiment is UV-C. The optical coating-film 18 includes an insulation layer 18A and a reflection layer 18B. The material of the insulation layer 18A is selected from the group consisting of silicon oxide and aluminum oxide. The material of the reflection layer 18B is metal such as aluminum. As shown in FIG. 4, the metals having preferred reflection performance are gold, silver, copper, and aluminum. In particular, aluminum has superior reflectivity for light with wavelengths shorter than 300 nm. In other words, aluminum has preferred reflectivity for UV light.

Figure 5:
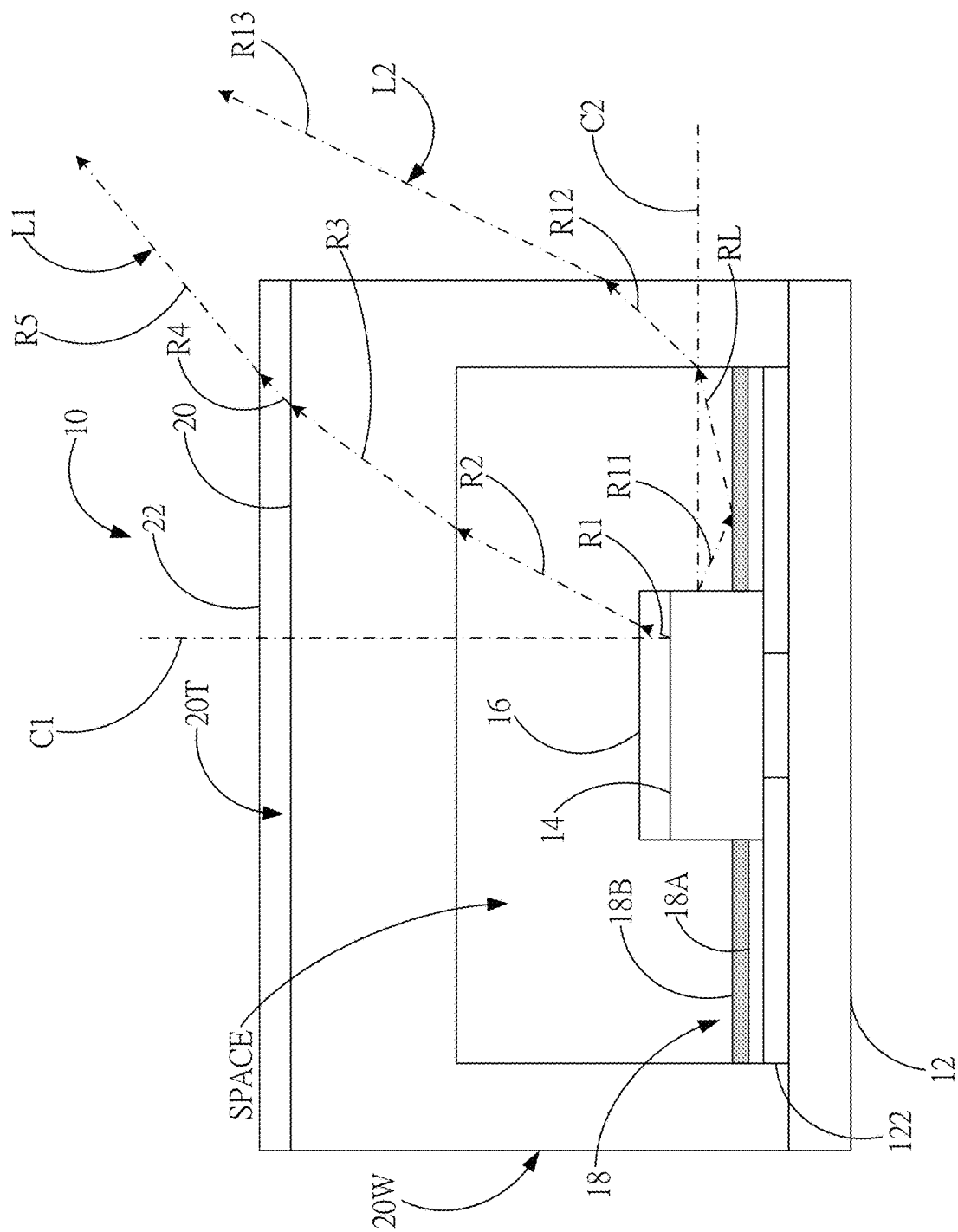
FIG. 5 shows a side view of the UV light paths according to an embodiment of the present application.

As shown in FIG. 5, the upward UV light from the UV LED chip 14 deviates from the first optic axis C1, passes through the top 20T of the optical member 20, and passes through the coating layer 22 for forming a first propagation path L1. The UV light emitted from the UV LED chip 14 emits upwards to the anti-reflection layer 16. While entering the anti-reflection layer 16, the first refraction occurs and producing the first refraction light R1. While leaving the anti-reflection layer 16 and entering the accommodation space SPACE, the second refraction occurs and producing the second refraction light R2. Next, while entering the optical member 20, the third refraction occurs and producing the third refraction light R3. By entering the coating layer 22, the fourth refraction occurs and producing the fourth refraction light R4. While emitting to the outside of the optical member 20, the fifth refraction occurs and thus producing the fifth refraction light R5. The first refraction light to the fifth refraction light form the first propagation path L2 of the UV light.

Besides, the lateral UV light from the UV LED chip 14 deviates from the second optic axis C2. The it is reflected by the reflection layer 18B and passes through the sidewall 20W of the optical member 20 form forming a second propagation path L2. The UV light emitted from the UV LED chip 14 emits laterally to enter the accommodation space SPACE. Then the first refraction occurs and producing the first lateral refraction light R11. The first lateral refraction light R11 deviates from the second optic axis C2 and is reflected by the reflection layer 18B, producing the reflection light RL. Next, the reflection light RL is incident to the sidewall 20W of the optical member 20 and producing the second refraction, giving the second lateral refraction light R12. The second lateral refraction light R12 is incident to the outside of the optical member 20, producing the third refraction and giving the third lateral refraction light R13. The first lateral refraction light R11 to the third lateral refraction light R13 form the second propagation path L2. Accordingly, by replacing the package material according to the prior art by the optical member 20, the deterioration problem of package material due to UV exposure can be avoided.

Figure 6:
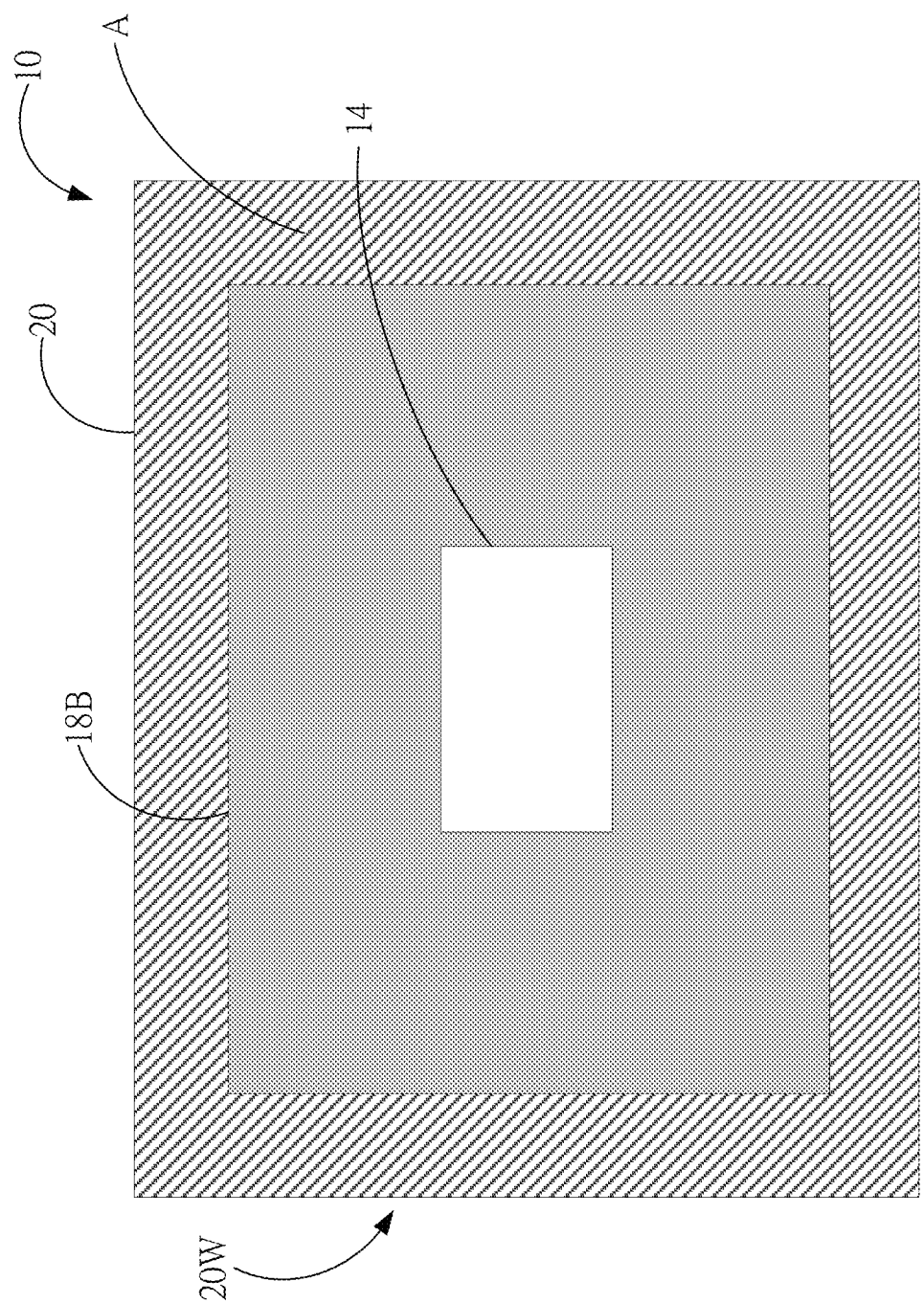
FIG. 6 shows a top view of the cross-section A according to an embodiment of the present application.
Figure 7:
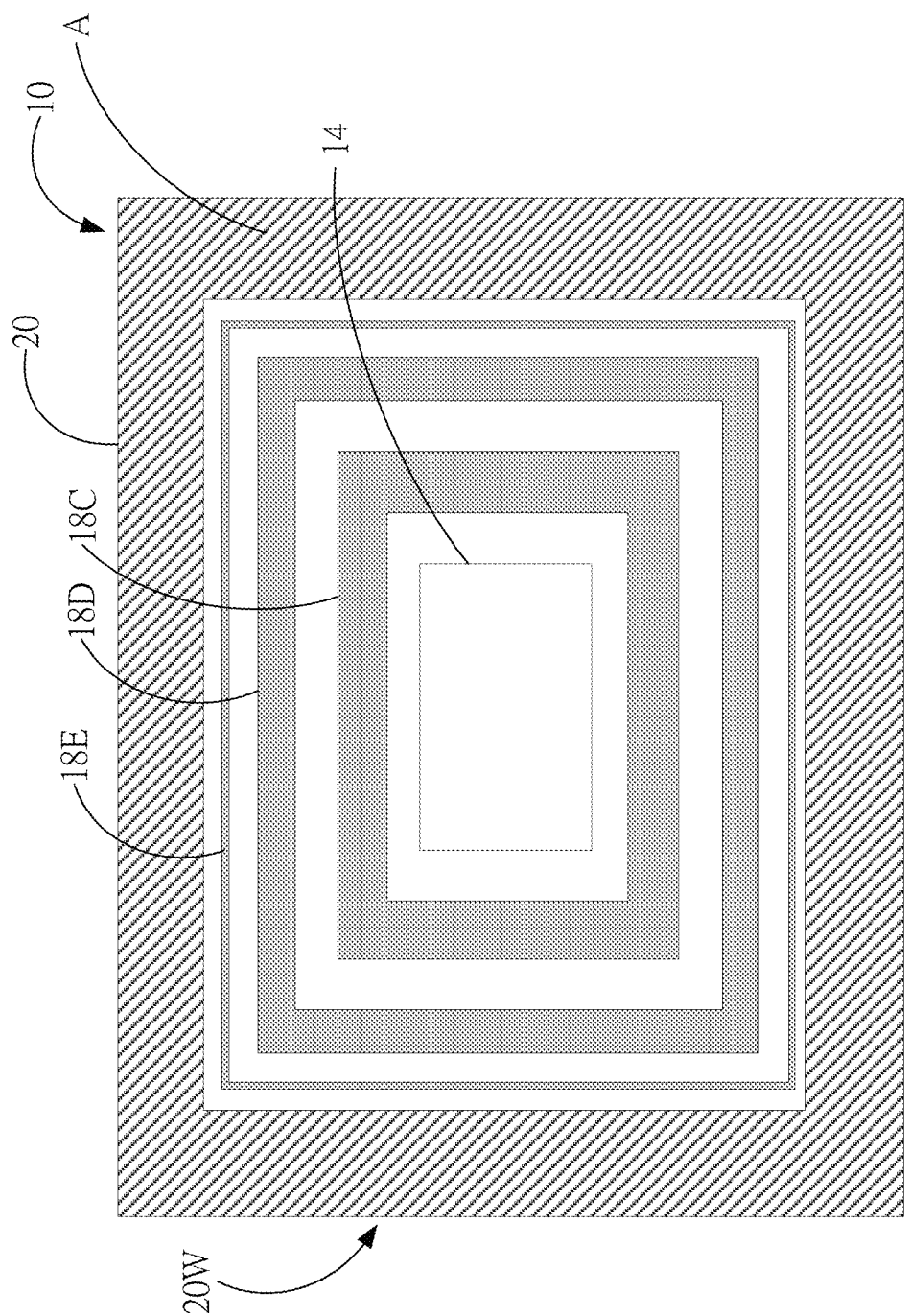
FIG. 7 shows another top view of the cross-section A according to an embodiment of the present application.

As shown in FIG. 6, which shows a top view of the cross-section A according to an embodiment of the present application. As shown in the figure, the reflection layer 18B covers the periphery of the UV LED chip 14. Namely, the reflection layer 18 is a fully covered aluminum part. As shown in FIG. 7, the reflection layer 18B is changed to a plurality of annular parts with widths depending on the location. The outer the reflection 18B is, the thinner the width will be. In other words, the width of the first annular part 18C is greater than the width of the second annular part 18D; the width of the second annular part 18D is greater than the width of the third annular part 18E. Since the reflection performance is proportional to the width, the reflection intensity of the plurality of annular part, namely, the first annular part 18C, the second annular part 18D, and the third annular part 18D, decrease from the inside to the outside.

To sum up, the present application provides a UV LED package structure with enhancing light extraction efficiency and the method for manufacturing the same. According to the present application, the UV LED and the anti-reflection layer are disposed on the substrate sequentially. Then the optical member replaces the package material according to the prior to cover the UV LED chip and the anti-reflection layer for preventing the deterioration problem owing to long-term UV exposure. In addition, the optical coating-film is further disposed surrounding the UV LED chip for improving the reflection performance around the UV LED chip.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

What is claimed is:

1. An ultraviolet light-emitting diode package structure for improving light extraction, comprising:
    a substrate;
    an ultraviolet flip-chip LED chip, disposed on said substrate;
    an anti-reflection layer, covering said ultraviolet light-emitting diode chip, and the material of said anti-reflection layer being selected from the group consisting of hafnium oxide and a combination of hafnium oxide and magnesium fluoride;
    an optical coating-film, disposed on said substrate and located surrounding said ultraviolet light-emitting diode chip, including an insulation layer and an aluminum layer, wherein said aluminum layer is a plurality of annular aluminum parts with different widths from inside to the outside, and reflection intensities of said annular aluminum parts decreasing from inside to the outside; and
    an optical member, sealed and covered and surround on said substrate, including an accommodation space, said optical member further covering said ultraviolet light-emitting diode chip and said anti-reflection layer by said accommodation space, a gap formed between said optical member and both of said ultraviolet light-emitting diode chip and said anti-reflection layer, and said accommodation space being filled with air or vacuum, wherein said optical member is further coated by silicon oxide or silicon merely;
    wherein said ultraviolet light-emitting diode chip emits ultraviolet light upwards and laterally, said optical member covers light-emitting directions of said ultraviolet light except side of said substrate; said upward ultraviolet light passes through said anti-reflection layer, said accommodation space, and said optical member; said lateral ultraviolet light is reflected by said optical coating-film, passes through said accommodation space, and then passes through said optical member.

2. The ultraviolet light-emitting diode package structure of claim 1, wherein the material of said anti-reflection layer is further selected from the group consisting of silicon oxide, aluminum oxide, magnesium oxide, yttrium oxide ($Y_2O_3$), calcium fluoride, beryllium oxide, gadolinium oxide ($Gd_2O_3$), calcium oxide, thorium oxide ($ThO_2$), and lead lanthanum zirconate titanate ceramics (PLZT).

3. The ultraviolet light-emitting diode package structure of claim 1, wherein a first width of said optical member is at least five times a second width of said ultraviolet light-emitting diode chip.

4. The ultraviolet light-emitting diode package structure of claim 1, wherein the material of said optical member is quartz.

5. The ultraviolet light-emitting diode package structure of claim 1, wherein said substrate is a conductive substrate or a nonconductive substrate.

6. The ultraviolet light-emitting diode package structure of claim 5, wherein the material of said nonconductive substrate is selected from aluminum nitride and aluminum oxide.

* * * * *